United States Patent [19]
Huang et al.

[11] Patent Number: 5,654,589
[45] Date of Patent: Aug. 5, 1997

[54] LANDING PAD TECHNOLOGY DOUBLED UP AS LOCAL INTERCONNECT AND BORDERLESS CONTACT FOR DEEP SUB-HALF MICROMETER IC APPLICATION

[75] Inventors: Richard J. Huang, Milpitas; Robin W. Cheung, Cupertino; Rajat Rakkhit, Milpitas; Raymond T. Lee, Sunnyvale, all of Calif.

[73] Assignee: Advanced Micro Devices, Incorporated, Sunnyvale, Calif.

[21] Appl. No.: 466,649

[22] Filed: Jun. 6, 1995

[51] Int. Cl.⁶ .................... H01L 23/48; H01L 23/52; H01L 29/40

[52] U.S. Cl. .................... 257/763; 257/751; 257/770; 257/915

[58] Field of Search .................... 257/763, 751, 257/753, 767, 770, 915

[56] References Cited

U.S. PATENT DOCUMENTS

| | | | |
|---|---|---|---|
| 4,926,237 | 5/1990 | Sun et al. | 257/751 |
| 5,278,448 | 1/1994 | Fujii | 257/750 |
| 5,360,995 | 11/1994 | Graas | 257/751 |

Primary Examiner—Mahshid D. Saadat
Assistant Examiner—T. M. Arroyo
Attorney, Agent, or Firm—Benman Collins & Sawyer

[57] ABSTRACT

The present invention is directed to a technology that simplifies the process of fabricating multilayer interconnects and reduces capacitance in integrated circuits employing multilayer interconnects. The novel landing pad technology of the present invention simplifies the current process steps involved in the formation of multilayer interconnects. The same contact/via etch, the same PVD TiN deposition, etc., can be modularized and repeated to build up multilayer metalization. The process of the present invention for forming multilayer interconnects involves the formation of Ti/TiN stack interconnect structures that can be used as local interconnects and contact landing pads on the same level. The contact landing pads facilitate the use of a borderless contact approach which enables a reduction in the size of the source-drain area. As the source-drain area is reduced, junction capacitance decreases, and packing density can be increased. Source-drain real estate can be also be minimized by using the Ti/TiN stack interconnect structures as contact landing pads in the implementation of raised source-drain technology. The Ti/TiN stack interconnect structures can also be used as short local interconnects in SRAM devices.

13 Claims, 4 Drawing Sheets

LANDING PAD TECHNOLOGY DOUBLED UP AS LOCAL INTERCONNECT AND BORDERLESS CONTACT FOR DEEP SUB-HALF MICROMETER IC APPLICATION

CROSS-REFERENCE TO RELATED APPLICATION

This application is related to the application Ser. No. 08/470,302, filed on even date herewith. That application concerns the formation of a Ti/TiN landing pad at the base of contact and via openings in a dielectric to improve the throughput of the process for fabricating multilayer interconnects. The present application is directed to a technology which employs Ti/TiN stack interconnect structures as local interconnects and contact landing pads to simplify the process of fabricating multilayer interconnects, to allow for tighter lay-out rules for die-size reduction, as well as to reduce capacitance in integrated circuits.

TECHNICAL FIELD

The present invention relates generally to semiconductor processing, and, more particularly, to simplifying the process of fabricating multilayer interconnects, allowing for tighter lay-out rules for die-size reduction, as well as reducing the RC time constant of integrated circuits (ICs) employing multilayer interconnects.

BACKGROUND ART

With increases in circuit speed and miniaturization of ICs, parasitic effects become the bottleneck of IC performance. The RC time constant becomes the dominate part in controlling the performance of IC circuits, especially microprocessors. There are two different paths to controlling the contribution of parasitic effects.

The first path is to control the passive parasitic effects in interconnect systems which form connections to the source, gate, and drain electrodes. In such interconnect systems, metal connections are made by multilayer interconnects supported over the substrate by an interlayer dielectric. To control passive parasitic effects in interconnect systems, technologists have proposed to use low dielectric constant materials such as SiOF, BN, polyimides, Teflon™, BCB (benzocyclobutene), and other spin-on materials as the dielectric, so that the conductor-to-conductor coupling is minimized. Others have proposed to use low-resistance interconnect systems based on low resistance conductors such as copper, gold, etc. Still others have proposed to use "pseudo-low dielectric constant technology", i.e., exchange complexity for relaxed design rules such that more metal interconnect layers are used and each layer can use less aggressive design rules; see patent application Ser. No. 08/330,767, filed on Oct. 28, 1994, by R. W. Cheung entitled "Pseudo-low Dielectric Constant Technology", now U.S. Pat. No. 5,471,093 issued Nov. 28, 1995.

The second option for controlling the contribution of parasitic effects in integrated circuits is to control the active capacitance. Some technologists have proposed to lower the active capacitance, i.e., minimize the overlap capacitance of the transistor by reducing the Miller capacitance. The LDD (lightly doped drain) approach is one proposed technology that can minimize Miller capacitance. Others have proposed a "Raised Source-Drain" technology for minimizing the source-drain area and hence reducing the capacitance.

In addition to controlling parasitic effects, low-resistance interconnect systems are useful in other applications. In particular, there is also a need for low resistance local interconnects for some applications in SRAM (static random access memory) technology. With the advance of local interconnect (LI) technology, one can optimize the cell size of the SRAM core cell and provide highly competitive SRAM technologies. Accordingly, some technologists have proposed "amorphous Si LI" technology comprising Si/Ti interconnect structures. Others have proposed "Stable LI technology" comprising Si/Ti/TiN/Ti interconnect structures, see, e.g., patent application Ser. No. 08/309,692, filed on Sep. 21, 1994, by S. Kamaswami et al entitled "A Stable Local Interconnect/Active Area Silicide Structure for VLSI Applications", now U.S. Pat. No. 5,451,545 issued Sep. 19, 1995. Still others have proposed TiN as the LI structure.

All the proposed interconnect systems discussed above can provide some relief to technology requirements in one form or another; however, none provide a comprehensive solution. Accordingly, there remains a need for such comprehensive solution.

DISCLOSURE OF INVENTION

In accordance with the invention, a process is provided for forming multilayer interconnects which involves the formation of Ti/TiN stack interconnect structures that can be used as local interconnects and contact landing pads on the same level. The local interconnects and contact landing pads directly contact conductive regions of a semiconductor integrated circuit. Contact may be formed with previously-doped regions in the semiconductor substrate, polysilicon, or other metal layers.

The process for forming multilayer interconnects for connecting conductive regions to conductive regions separated by insulating regions supported on a semiconductor substrate comprises:

(a) forming a layer of Ti on the insulating regions and the conductive regions;

(b) forming a first layer of TiN on the layer of Ti;

(c) patterning and etching the layer of Ti and the first layer of TiN to form at least one Ti/TiN stack interconnect structure selected from the group consisting of (1) a contact landing pad contacting one of the conductive regions, (2) a local interconnect contacting at least two of the conductive regions, forming electrical connection therebetween, and (3) a local interconnect contacting at least one of the conductive regions and comprising at least one contact landing pad, forming electrical connection therebetween;

(d) forming an interlayer dielectric over the semiconductor substrate;

(e) etching contact openings in the interlayer dielectric down to at least one of the contact landing pads or one of the local interconnects, each of the contact openings having a bottom and sidewalls;

(f) depositing a second layer of TiN such that the second layer of TiN is formed on the bottom and the sidewalls of the contact openings;

(g) depositing a layer of metal thereby filling the contact openings with the layer of metal;

(h) removing the second layer of TiN and the layer of metal outside of the contact openings thereby forming metal plugs in the contact openings; and (i) forming a first layer of metal interconnects on the interlayer dielectric contacting the metal plugs.

Any number of additional levels comprising additional layers of metal interconnects can be formed by repeating a portion of the steps outlined above. The steps required to form additional levels involve forming an additional interlayer dielectric, etching additional contact/via openings, depositing an additional second layer of TiN, filling the additional contact/via openings with an additional layer of metal, forming additional metal plugs, and forming an additional layer of metal interconnects. With the novel landing pad technology of the present invention, the processing is truly modular, i.e., process steps will be identical from one level of metalization to another.

In accordance with present invention, the contact landing pad may overlap the insulating regions surrounding the contact landing pad. The oversized contact landing pad facilitates the use of a borderless contact approach which enables a reduction in the size of the source-drain area and a reduction in contacted source-drain design rules.

The insulating regions may comprise oxide as in the case where the insulating regions are field oxide regions.

A portion of the insulating regions may comprise an insulating layer that is formed on the conductive regions and field oxide regions surrounding the conductive regions. The insulating layer is patterned and etched to form a window above at least one of the conductive regions prior to forming the layer of Ti.

As indicated above, the Ti/TiN stack interconnect structures of the present invention can be used as local interconnects and contact pads on the same level.

The Ti/TiN stack interconnect structures of the present invention can be used as contact landing pads for source-drain electrodes.

The Ti/TiN stack interconnect structures of the present invention can also be used as local interconnects to contact cross-coupled static SRAM cell pull-up and pull-down transistors effectively without increasing the cell size. The standard prior art technology uses multiple levels of interconnect metalization. The standard prior art technology usually occupies more real estate.

The present invention simultaneously provides the following:

1. a technology that can provide local interconnect requirements of roughly about 5 ohms/sq sheet resistance;

2. a technology that can provide a raised source-drain application so that the source-drain real estate area can be minimized;

3. a technology that can provide a borderless contact approach, whereby the contact opening can fall off the source-drain area and yet provide good electric characteristics; the use of borderless contacts having the added benefit of reducing source/drain parasitic capacitance;

4. a technology that is compatible with the "monolayer technology" for advanced BEOL (back-end-of line) tungsten applications; see patent application Ser. No. 08/402,254, filed Mar. 10, 1995, by R. J. Huang, entitled "Low Cost Solution to High Aspect Ratio Contact/Via Adhesion Layer Application for Deep Sub-half Micrometer Back-end-of Line Technology";

5. a technology that is compatible with existing tooling in the factory wherein new hardware is not required, translating to low-cost as well as highly manufacturable technology; and 6. a technology, with the raised source-drain and borderless contact provision, which can support much reduced source-drain real estate, hence, increasing the packing density.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

The present invention is directed to a landing pad technology that enables the formation of local interconnects and borderless contacts that make contact with conductive regions of a semiconductor integrated circuit. Contact may be formed with previously-doped regions in the semiconductor substrate, polysilicon, or other metal layers. Contacts made to doped regions in the semiconductor substrate or to a titanium silicide layer on doped regions in the semiconductor substrate become source or drain contacts. Contacts made to a polysilicon layer or a titanium silicide layer (titanium polysilicide, in this case) on a polysilicon layer which is formed over a thin oxide gate layer become gate electrodes. Contacts may also be made to polysilicon lines or a titanium silicide layer (titanium polysilicide, in this case) on a polysilicon line as well as to metal interconnect lines with the proposed landing pad technology of the present invention.

Figure 1A:
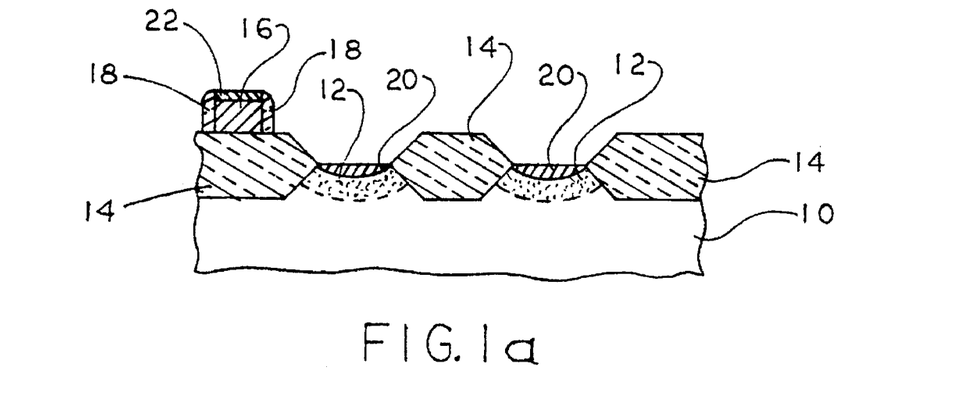
FIGS. 1a–1h are cross-sectional views depicting a process of the invention and the resulting structure.

FIG. 1a is a cross-sectional view of a wafer comprising a semiconductor substrate 10, such as silicon, on which is formed a plurality of conductive regions (i.e., doped regions) 12. Field oxide regions 14 separate the doped regions 12 from each other. A polysilicon line 16 is shown formed on the surface of one of the field oxide regions 14, with oxide spacers 18 on the sides thereof. While one such polysilicon line 16 is shown, it will be readily apparent to those skill in the art that in fact a plurality of such polysilicon lines exist on field oxide regions 14 on the semiconductor substrate 10 of an integrated circuit.

A titanium silicide layer 20 is formed on the doped regions 12 in the semiconductor substrate 10 while a titanium polysilicide (or polycide) layer 22 is formed on the surface of the polysilicon line 16. The formation of the titanium silicide layer 20 and titanium polysilicide layer 22 is completed by rapid thermal anneal. The excess non-reacted titanium is selectively stripped off and a second anneal is provided thereafter.

Figure 1B:
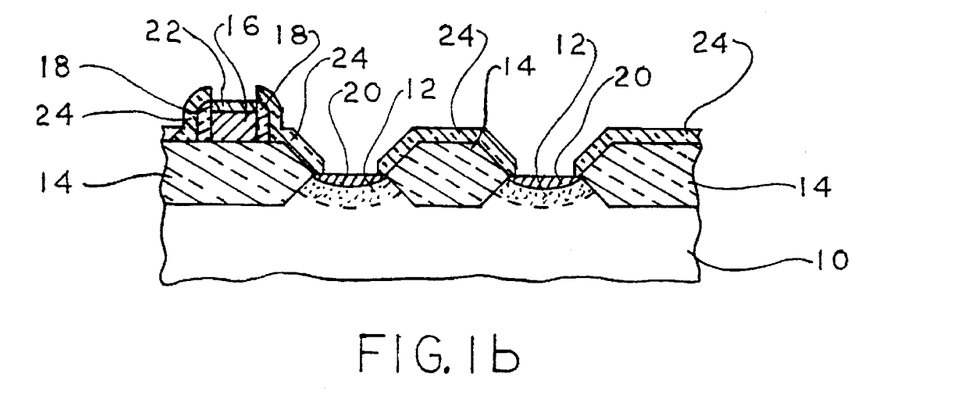

An insulating layer, (i.e., an oxide layer) 24 comprising PECVD (plasma enhanced chemical vapor deposited) $SiO_2$ which can be TEOS (tetra-ethyl orthosilicate) based is formed as shown in FIG. 1b. The PECVD $SiO_2$ can also be SiH$_4$ based or even HDP (high density plasma) based CVD (chemical vapor deposited) SiO$_2$. The insulating layer 24 may also comprise silicon oxy-nitride or Si$_3$N$_4$. The requirements for this insulating layer 24 are good film uniformity and that the insulating layer serves as a good moisture barrier. Based on literature, the best barrier is Si$_3$N$_4$, followed by HDP-based CVD SiO$_2$, and silicon-rich SiH$_4$-based PECVD SiO$_2$, in that order. The thickness of the insulating layer 24 ranges from 500Å to 2000Å; the preferred thickness being about 1000Å. The insulating layer, or oxide layer 24 is patterned using a local interconnect and landing pad window mask and etch. FIG. 1b illustrates the structure of the device after the removal of the mask. The window on the titanium polysilicide (or polycide) layer 22 on the surface of the polysilicon line 16 can be oversized.

Figure 1C:
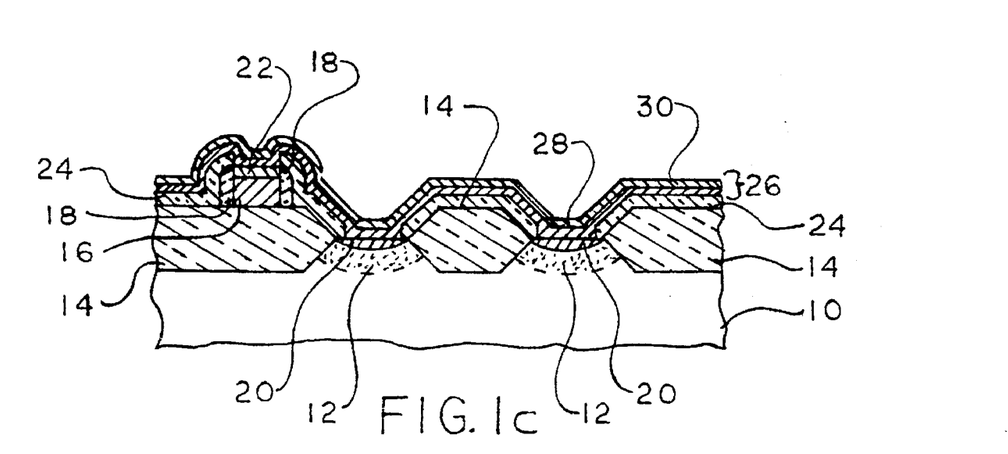

In accordance with the invention, a Ti/TiN stack 26 comprising a layer of Ti 28 and a layer of TiN (first layer of TiN) 30 is formed as depicted in FIG. 1c. The layer of Ti 28 is deposited before the first layer of TiN 30 in a cluster PVD (physical vapor deposition) tool. The layer of Ti 28 serves to reduce contact resistance, enhance TiN adhesion on the surface of the field oxide regions 14, and reduce the resistivity of the Ti/TiN stack 26 for local interconnect applications.

The process technology can use relaxed temperature settings for optimization of resistivity. Typically, to form titanium silicide above a junction, a rapid thermal anneal (RTA) is performed at about 600° C. to 650° C. With higher temperatures, more silicon at the junction is consumed in forming thicker titanium silicide. The shallow junctions employed in current 0.35 μm and future 0.25 μm and 0.18 μm technologies, however, require minimum silicon consumption. Accordingly, a lower temperature RTA is preferred. Reduction in RTA temperature produces thinner titanium silicide and less silicon consumption, but results in higher contact resistance. The layer of Ti 28 used in the present invention reduces contact resistance enabling the use of relaxed temperature settings that optimize resistivity. If the first layer of TiN 30 is deposited after metal deposition, however, temperature options may be limited due to "metal ring and worm" defects which are caused by the mismatch in metalization processing temperatures.

The thickness of the layer of Ti 28 and the first layer of TiN 30 is optimized based on device requirements. For a 400° C. set-point processing of TiN, one should be able to achieve about 60 μΩ-cm bulk resistivity for the first layer of TiN 30. The optimized Ti process can also give about 60 μΩ-cm bulk resistivity for the layer of Ti 28. Thus, the total thickness required for this Ti/TiN stack 26 to achieve 5Ω/sq is about 1000Å. The total recommended thickness is about 350Å for the layer of Ti 28 and about 800Å for the first layer of TiN 30.

Figure 1D:
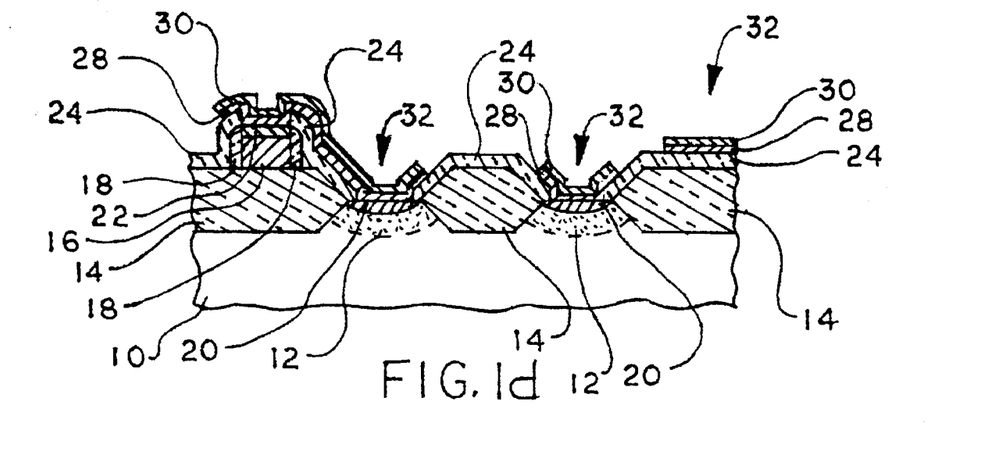

Next, the layer of Ti 28 and the first layer of TiN 30 are patterned using a local interconnect and contact landing pad window mask and etch. A series of Ti/TiN stack interconnect structures 32 (shown in FIG. 1d) are produced from the etched layer of Ti 28 and the etched layer of TiN 30. FIG. 1d illustrates the structure of the device after the removal of the mask. These Ti/TiN stack interconnect structures 32 serve as local interconnect and contact landing pads. The local interconnect and contact landing pads can be oversized to increase alignment tolerances. The borderless contact is an example where an oversized contact landing pad enables increased alignment tolerances.

The Ti/TiN stack interconnect structure 32 (left side of FIG. 1d) connecting the polysilicon line 16 with one of the doped regions 12 demonstrates the use of the landing pad technology as a short local interconnect as well as a contact landing pad/borderless contact. The Ti/TiN stack interconnect structure 32 contacting one of the doped regions 12 (right side of FIG. 1d) illustrates the use of the landing pad technology as a contact landing pad/borderless contact. The Ti/TiN stack interconnect structure 32 over one of the field oxide regions 14 (fight side of FIG. 1d) demonstrates the use of the landing pad technology as a contact landing pad for the rest area in the implementation of raised source-drain technology (to be discussed more fully below). In a similar manner the Ti/TiN stack interconnect structures 32 of the present invention can be used as short local interconnects in SRAM devices, as contact landing pads/borderless contacts for source-drain electrodes and as contact landing pads in the implementation of raised source-drain technology. In particular, the Ti/TiN stack interconnect structures 32 of the present invention can be used as short local interconnects to contact cross-coupled static SRAM cell pull-up and pull-down transistors effectively without increasing the cell size.

After masking and etching, the Ti/TiN stack interconnect structures 32 are exposed to a rapid thermal anneal. The KTA step, which is performed after the local interconnect and the contact landing pad patterning, will help ensure good adhesion of Ti to the oxide. Accordingly, the RTA improves the adhesion of Ti/TiN stack interconnect structures 32 on the field oxide regions 14. At the same time the RTA reduces the Ti reaction to oxide in the field area, preventing undesired residue clean-up in later processing steps. The RTA, consistent with the current barrier metal deposition (BMD) annealing processes, is performed at 600° C. in an N$_2$ ambient for a period of 60 seconds.

This RTA step results in further reaction of the titanium silicide layer 20 formed on the silicon, with the desired outcome of lowering the contact resistance. The RTA allows the Ti deposited on the titanium silicide layer 20 to consume the native oxide, which is approximately 20Å thick and which is formed on the silicided and salicided areas. Accordingly, the Ti is transformed into titanium silicide to improve contact resistance. If TiN is deposited on the titanium silicide layer 20, the native oxide will not be consumed.

Figure 1E:
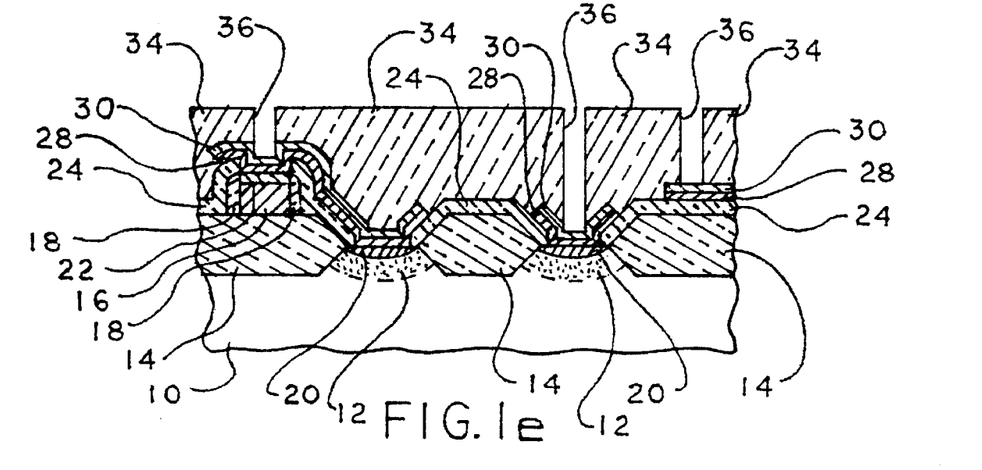

FIG. 1e shows an interlayer dielectric 34 which is deposited after the formation of the Ti/TiN stack interconnect structures 32. A contact mask and etch is employed to form contact openings 36 in the interlayer dielectric 34. The contact etch stops on the first layer of TiN 30 with minimum loss. FIG. 1e illustrates the structure of the device after the removal of the mask. Use of the first layer of TiN 30 on the contact level as an etch stop serves to preserve the shallow junction in the doped regions 12 beneath the patterned layer of Ti 28. The oversized contact landing pads ease alignment tolerances for the contact openings 36. The present invention simplifies the production process as existing via etch recipes can be employed. In such via etch recipes, the via etch stops on a TiN layer, or TiN anti-reflection coating, on the surface of a layer of metal interconnects with minimum loss, see, e.g., above-mentioned patent application Ser. No. 08/402, 254.

Figure 1F:
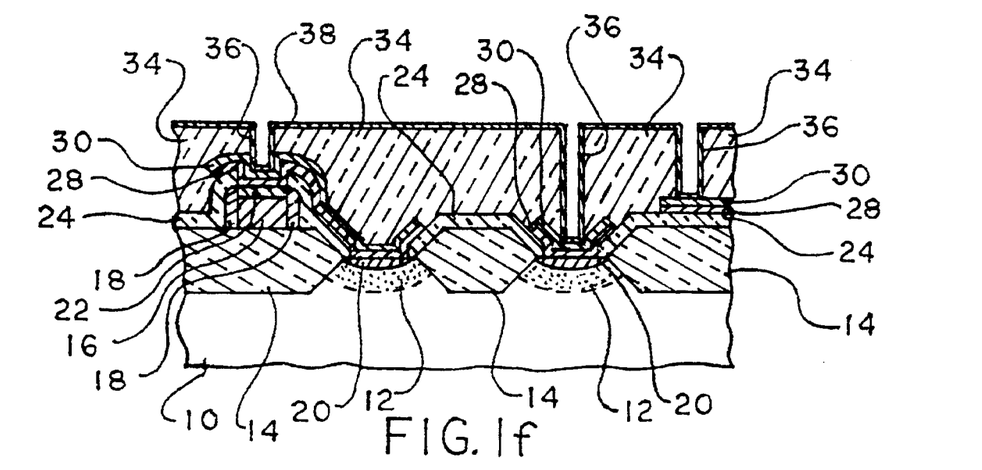

Next, the surface of the wafer is sputter-cleaned. A second layer of TiN (TiN adhesion layer) 38 is then deposited, as shown in FIG. 1f. The minimum thickness requirement for this TiN adhesion layer 38 is to have at least 50Å on the field area and at least a monolayer of TiN deposited on the sidewalls of the contact openings 36, see above-mentioned patent application Ser. No. 08/402,254.

The technology employed in this present step is scalable to high aspect ratio contact openings 36 (as well as via openings) and to feature sizes below 0.25 µm. The use of a Ti/TiN contact landing pad at the bottom of the contact opening 36 eases concern about both PVD Ti/TiN and PVD TiN step coverage and can extend the lifetime of low cost PVD technology. Consequently, there is no need for CVD TiN at least for several generations.

By easing concern about TiN step coverage, the approach of the present invention achieves the desired affect of using Ti/TiN as a barrier metal, but avoids the problem of volcano defects. Volcano defects are caused by Ti exposure during tungsten deposition, due to incomplete TiN coverage. If the TiN step coverage is not complete enough to cover the layer of Ti 28 with TiN, $WF_6$ employed in tungsten deposition will react with the Ti and form titanium fluoride. This gaseous titanium fluoride will prevent tungsten deposition, build up pressure, and possibly cause explosions. With complete TiN coverage, concern about Ti exposure and the formation of tungsten volcano defects is avoided.

There is no need for RTA at this step. Also, no wet pre-clean, which has already reached its limitations, is required before deposition of the TiN adhesive layer 38. Prior art wet pre-clean involves adding surfactant which is limited by surface tension from cleaning the small contact openings which are smaller than 0.2 µm.

Figure 1G:
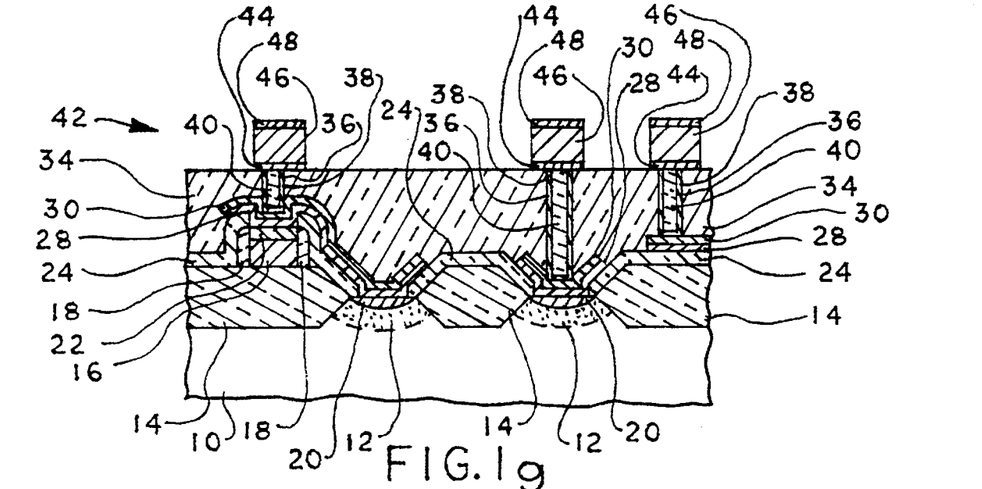

The deposition of the TiN adhesion layer 38 is followed by the blanket deposition of a tungsten layer (not shown) which fills the contact openings 36 with tungsten. Chemical-mechanical polishing (CMP) or plasma etchback is employed to remove any overfill areas, i.e., tungsten and TiN outside of the contact openings 36. FIG. 1g depicts a plurality of metal plugs 40 formed by CMP or plasma etchback. In this case, the metal plugs 40 comprise tungsten; however, the metal plugs may comprise other metals such as copper, gold, and aluminum. Accordingly, a layer of copper, gold, or aluminum must be blanket deposited in place of the tungsten layer.

The TiN adhesion layer 38 on the sidewalls of the contact openings 36 serves to structurally support the adhesion of the metal plugs 40. The layer of Ti 28 and the first layer of TiN 30 which are now at the bottom of the contact openings 36, along with possibly a monolayer of TiN originating from the TiN adhesion layer 38, provides good contact resistance and junction protection.

Next, a first metal stack layer is deposited on the surface of the wafer. The first metal stack layer is patterned with a mask and etch to form a first layer of metal interconnects 42. The first metal stack layer, and thus the first layer of metal interconnects 42, comprises a bottom layer 44 comprising TiN or Ti, a central layer 46 comprising tungsten and a top layer 48 comprising TiN. FIG. 1g depicts the structure of the device after the mask has been removed.

Figure 1H:
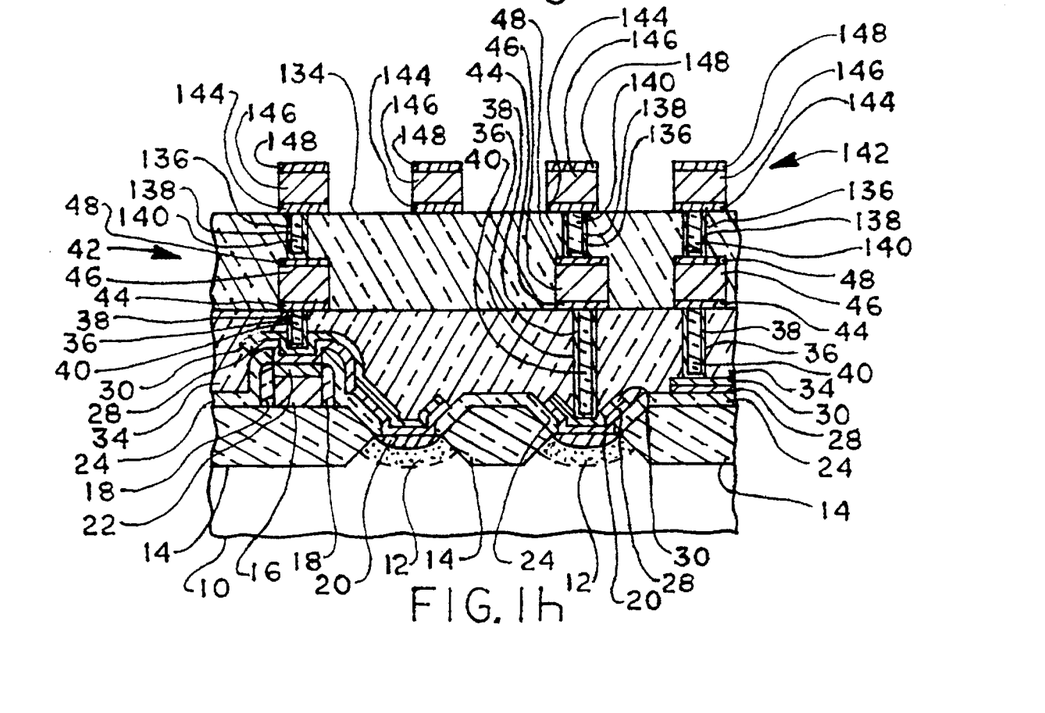

To form an additional level comprising an additional layer of metal interconnects 142, an additional interlayer dielectric 134 is deposited as shown in FIG. 1h. A contact mask and etch is employed to form additional contact/via openings 136. (Since openings are etched in the additional interlayer dielectric 134 down to a metal layer, the openings are hereinafter referred to as contact/via openings 136 and the etch is referred to as a contact/via etch.) The contact/via etch stops on the first layer of TiN 48 on top of the layer of first metal interconnects 42 with minimum loss. As indicated above, to simplify the production process, existing via etch recipes can be used for the contact/via etch. Furthermore, the same contact etch process employed above can be used as the contact/via etch process used at this stage as well.

As before, the surface of the wafer is sputter-cleaned. Next, an additional TiN adhesion layer 138 is deposited. The same TiN deposition as discussed above is employed at this stage of processing as well. Again, the minimum thickness requirement for this additional TiN adhesion layer 138 is to have at least 50Å on the field area and at least a monolayer of TiN deposited on the sidewalls of the contact/via openings 136.

The deposition of the additional TiN adhesion layer 138 is followed by the blanket deposition of a tungsten layer (not shown). Additional metal plugs 140 are formed by CMP or plasma etchback. The same blanket tungsten deposition and CMP or plasma etchback processes discussed above are employed at this stage of processing as well.

An additional metal stack layer is deposited on the surface of the wafer. The additional metal stack layer is patterned with a mask and etch to form an additional layer of metal interconnects 142. The additional metal stack layer and thus the additional layer of metal interconnects 142, again comprises a bottom layer 144 comprising TiN or Ti, a central layer 146 comprising tungsten and a top layer 148 comprising TiN. The same metal stack layer deposition and patterning processes as discussed above are employed at this stage of processing as well. FIG. 1h depicts the structure of the device after the mask has been removed.

Figure 2:
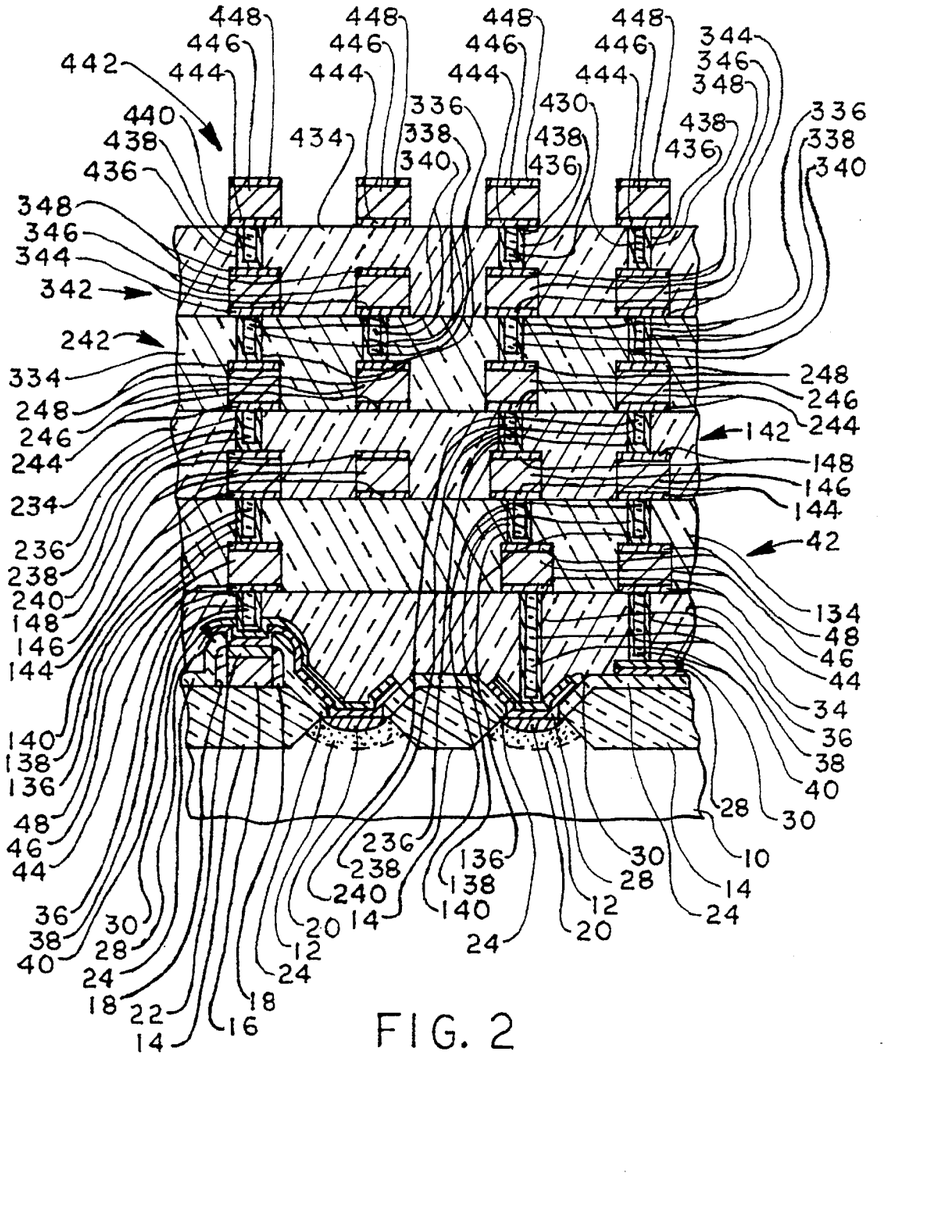
FIG. 2 is a cross-sectional view depicting the resulting structure of the present invention after multilayer metalization.

In accordance with present invention, any number of additional levels can be formed by repeating the steps outlined above. FIG. 2 depicts the structure of the device after multilayer metalization. The elements comprising each additional level are similar and accordingly possess like reference numerals preceded by a digit to specify the level (e.g., 134 for the first level, 234 for the second level, etc.).

With the novel landing pad technology of the present invention, the BEOL processing is truly modular, i.e., process steps will be identical from one level of metalization to another. No special process steps are required. The process for forming an additional layer of metal interconnects 142 can be repeated as many times as required to provide the additional multilayer metalization as shown in FIG. 2.

The novel landing pad technology of the present invention also facilitates the use of a borderless contact approach where the use of oversized contact landing pads increase alignment tolerances. The borderless contact approach enables a reduction in the size of the source-drain area as the source-drain area must no longer be widened to account for possible misalignment. The design rule used for standard prior art contact schemes is such that the source-drain area for a contact is typically 3X feature size; 1X feature size for the contact itself and 1X feature size surrounding the contact for overlay requirements. With the present invention, the source-drain area for contact can be reduced to no more than 2X feature size. Greater than 30% reduction in junction capacitance can be achieved. Design and fabrication will no longer be limited by the source-drain area, thus helping to relax the requirements for the source-drain feature area. Also, there is then no need to employ trench isolation or advanced bird's beak reduction LOCOS technology. More important, if metal pitch becomes packing density limited, the metal pitch can be matched to the source-drain area. The oversized contact landing pad will provide relaxed design rules. Thus, high performance and high yield can simultaneously be achieved.

If the source-drain is not pitch limited for packing density, one can entertain the "raised source-drain" concept. This concept, in its simplest form, is to place the contact landing pad on top of the field oxide regions 14 (e.g., right side of FIG. 1d) and to electrically connect this contact landing pad to the active area of the source-drain (i.e., doped regions 12)

using a local interconnect. Rather than forming the contact openings 36 directly above the active area of the source-drain, the contact openings can be positioned above to the field oxide regions 14. By forming the contact openings 36 over the field oxide regions 14, where a wide contact landing pad can be placed, the active area of the source-drain need not be widened to account for possible misalignment. This approach will reduce the active area capacitance, thus, increasing circuit performance.

Another option of this invention is that the insulating layer, or oxide layer, 24, which serves as a local interconnect and landing pad window mask, is not formed. The step of depositing, patterning and etching the oxide layer 24 is thus eliminated. This approach will require etching the Ti/TiN stack 26 and stopping on titanium silicide and titanium polysilicide in regions where local interconnects and contact landing pads are not to be formed. Accordingly, the etch must stop on titanium silicide and titanium polysilicide (rather than stopping on the oxide layer 24) which is possible with some field oxide loss. Reducing the thickness of the field oxide regions 14, however, may not be a good trade-off. The added 1000Å to 2000Å of oxide helps relieve the field oxide loss issues and maintain the field threshold voltage.

ADVANTAGES OF THE INVENTION

The present invention provides several advantages:

1. The present invention is designed for 0.35 μm and 0.25 μm technology as well as the generation beyond, i.e., to technology designed for feature sizes less than or equal to 0.18 μm.

2. The Ti/TiN stack interconnect structures 32 can be used as local interconnects and contact pads on the same level to fully utilize the material.

3. Use of the TiN as an etch stop on the contact level can protect the junction during contact etch, simplify the etch process, and provide better alignment tolerances.

4. The present invention can ease concern regarding step coverage of PVD films employed in current 0.35 μm and future 0.25 μm and 0.18 μm technologies.

5. The present invention can extend the lifetime of the low cost PVD technology and push back the need for high cost CVD TiN and damascene processes (by "damascene" is meant a process in which trenches or contact/via openings are formed and then filled with metal using CVD or PVD or other techniques, followed by a polish to remove any overfilled areas).

6. The present invention will simplify the current process steps, i.e., the same contact/via etch, the same PVD TiN deposition, etc., can be modularized and repeated to build up multilayer metalization.

INDUSTRIAL APPLICABILITY

The process of the invention for forming multilayer interconnects is expected to find use in the fabrication of silicon-based semiconductor devices.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bi-polar processes. Similarly, any process steps described might be interchangeable with other steps in order to achieve the same remit. The embodiment was chosen and described in order to best explain the principles of the invention and is practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A multilayer interconnect structure for connecting conductive regions to conductive regions separated by insulating regions supported on a semiconductor substrate, said multilayer interconnect structure comprising:

(a) at least one Ti/TiN stack interconnect structure comprising a layer of Ti and a first layer of TiN formed thereon, each of said Ti/TiN stack interconnect structures selected from the group consisting of (1) a contact landing pad formed on one of said conductive regions, (2) a local interconnect formed on at least two of said conductive regions, forming electrical connection therebetween, and (3) a local interconnect formed on at least one of said conductive regions and comprising at least one contact landing pad, forming electrical connection therebetween;

(b) an interlayer dielectric formed over said semiconductor substrate on regions including, but not limited to, said Ti/TiN stack interconnect structures and said insulating regions;

(c) contact openings etched in said interlayer dielectric down to said first layer of TiN of said contact landing pads or said local interconnects, each of said contact openings having a bottom and sidewalls;

(d) a second layer of TiN deposited on said bottom and said sidewalls of said contact openings;

(e) metal plugs formed in said contact openings;

(f) a first layer of metal interconnects formed on said interlayer dielectric contacting said contact openings.

2. The multilayer interconnect structure of claim 1 wherein said conductive regions are selected from the group consisting of doped regions in said semiconductor substrate, a titanium silicide layer on doped regions in said semiconductor substrate, polysilicon, and a titanium polysilicide layer on polysilicon.

3. The multilayer interconnect structure of claim 1 wherein said contact landing pad overlaps said insulating regions surrounding said contact landing pad.

4. The multilayer interconnect structure of claim 1 wherein said metal plugs comprise metal selected from a group of metals consisting of tungsten, copper, gold, and aluminum.

5. The multilayer interconnect structure of claim 1 wherein said first layer of metal interconnects comprises a bottom layer comprising TiN or Ti, a central layer comprising tungsten, and a top layer comprising a layer of TiN.

6. The multilayer interconnect structure of claim 1 wherein field oxide regions surround said conductive regions and at least a portion of said insulating regions comprise an insulating layer that is formed on said conductive regions and said field oxide regions, said insulating layer comprising a window above at least one of said conductive regions.

7. The multilayer interconnect structure of claim 6 wherein said insulating layer is selected from a group of insulators consisting of plasma enhanced chemical vapor deposited $SiO_2$ which is tetra-ethyl orthosilicate based, plasma enhanced chemical vapor deposited $SiO_2$ which is $SiH_4$ based, high density plasma based chemical vapor deposited $SiO_2$, silicon oxy-nitride, and $Si_3N_4$.

8. The multilayer interconnect structure of claim 1 comprising at least one additional layer of metal interconnects, each said additional layer of metal interconnects formed on an additional interlayer dielectric associated therewith which is formed over said semiconductor substrate, each said additional layer of metal interconnects contacting a set of metal plugs associated therewith, wherein said metal plugs comprising each said set are formed in contact/via openings etched in said additional interlayer dielectric, each of said contact/via openings having a bottom and sidewalls, each of said contact/via openings having formed therein a layer of TiN on said bottom and said sidewalls to support the adhesion of said metal plugs comprising each said set, each said set of metal plugs forming electrical connection between (i) said additional layer of metal interconnects associated therewith and (ii) a separate layer of metal interconnects formed beneath said additional layer of metal interconnects.

9. The multilayer interconnect structure of claim 8 wherein each said additional layer of metal interconnects comprises a bottom layer comprising TiN or Ti, a central layer comprising tungsten, and a top layer comprising a layer of TiN.

10. The multilayer interconnect structure of claim 9 wherein said bottom layer comprises TiN.

11. The multilayer interconnect structure of claim 1 comprising one additional layer of metal interconnects formed on an additional interlayer dielectric which is formed over said semiconductor substrate, said additional layer of metal interconnects contacting a set of metal plugs associated therewith, wherein said metal plugs comprising said set are formed in contact/via openings etched in said additional interlayer dielectric, each of said contact/via openings having a bottom and sidewalls, each of said contact/via openings having formed therein a layer of TiN on said bottom and said sidewalls to support the adhesion of said metal plugs comprising said set, said set of metal plugs forming electrical connection between (i) said additional layer of metal interconnects associated therewith and (ii) said first layer of metal interconnects formed beneath said additional layer of metal interconnects.

12. The multilayer interconnect structure of claim 11 wherein said additional layer of metal interconnects comprises a bottom layer comprising TiN or Ti, a central layer comprising tungsten, and a top layer comprising a layer of TiN.

13. The multilayer interconnect structure of claim 12 wherein said bottom layer comprises TiN.

\* \* \* \* \*